United States Patent [19]
Kyogoku

[11] Patent Number: 6,053,686
[45] Date of Patent: Apr. 25, 2000

[54] DEVICE AND METHOD FOR LOAD LOCKING FOR SEMICONDUCTOR PROCESSING

[75] Inventor: Mitsusuke Kyogoku, Tama, Japan

[73] Assignee: ASM Japan K.K., Tokyo, Japan

[21] Appl. No.: 09/246,921

[22] Filed: Feb. 9, 1999

[30] Foreign Application Priority Data

Feb. 9, 1998 [JP] Japan ................................. 10-041011

[51] Int. Cl.⁷ ..................................................... B65G 1/06
[52] U.S. Cl. ........................... 414/217; 414/805; 414/937; 414/939; 414/941
[58] Field of Search ............................... 414/217, 744.3, 414/805, 937, 939, 941

[56] References Cited

U.S. PATENT DOCUMENTS

| | | | |
|---|---|---|---|
| 3,874,525 | 4/1975 | Hansen et al. | 414/805 |
| 4,400,125 | 8/1983 | Jensen | 414/805 |
| 4,892,455 | 1/1990 | Hine | 414/941 |
| 5,183,547 | 2/1993 | Ikeda | 414/217 |
| 5,223,001 | 6/1993 | Saeki | 414/217 |
| 5,879,128 | 3/1999 | Tietz et al. | 414/939 |

FOREIGN PATENT DOCUMENTS

| | | | |
|---|---|---|---|
| 405174776 | 7/1993 | Japan | 414/939 |
| 570967 | 11/1993 | Japan | 414/939 |

*Primary Examiner*—Robert P. Olszewski
*Assistant Examiner*—Paul T. Chin
*Attorney, Agent, or Firm*—Knobbe, Martens, Olson & Bear, LLP

[57] ABSTRACT

There is provided a load-lock device which allows high productivity and occupies a small space. There is provided a load-lock device which stands by with objects to be processed loaded thereon in order to cooperate with a transport mechanism in transporting the objects to be processed to processing chambers in order. The load-lock device according to the present invention comprises chamber means, wafer holding means for loading a plurality of the objects to be processed which is movable up and down in the chamber and flange means provided on a side of the wafer holding means which is engaged with a part of an inner wall of the chamber to divide the space inside the chamber into two isolated rooms. The transport mechanism is connected to a side of the chamber means substantially in the center thereof, and the flange means is coupled to the side of the wafer holding means substantially in the center thereof. The flange means includes sealing means which is engaged with a part of the inner wall of the chamber to achieve complete sealing. The load-lock device according to the invention allows a gate valve between the transport mechanism and the load-lock device to be removed to double the efficiency of the prior art at least.

14 Claims, 5 Drawing Sheets

DEVICE AND METHOD FOR LOAD LOCKING FOR SEMICONDUCTOR PROCESSING

BACKGROUND OF THE INVENTION

1. Field of the Invention

The present invention relates to a load-lock device which stands by with a plurality of semiconductor wafers loaded thereon to cooperate with a transport device for in order transporting the semiconductor wafers to a processing chamber and, more particularly, to a load-lock device having a structure to transport semiconductor wafers to a processing chamber efficiently.

2. Description of the Related Art

A conventional semiconductor processing apparatus has employed a load-lock device which stands by with a plurality of semiconductor wafers loaded thereon in order to transport objects to be processed such as semiconductor wafers to a processing chamber in order for processing therein. FIG. 1A shows a conventional single chamber type load-lock device. The load-lock device comprises a chamber 1 whose interior is evacuated, wafer holding means 6 for loading a plurality of semiconductor wafers 4 thereon, and a transport mechanism 7 for in order transporting the semiconductor wafers 4 from the wafer holding means 6 to a processing chamber 2. The chamber 1 includes a gate valve 3 for establishing communication between the processing chamber 2 and the chamber 1 and a front door 5 through which the wafer holding means 6 loaded with the semiconductor wafers 4 is transported in and out.

After the front door 5 is opened to allow a wafer holding means 6 loaded with the semiconductor wafers 4 to be transported into the chamber 1, the front door 5 is closed to evacuate the interior of the chamber 1. Then, the gate valve 3 is opened, and the transport mechanism 7 transports one of the semiconductor wafers 4 into the processing chamber 2. The semiconductor wafer 4 is returned to its initial position in the wafer holding means 6 after being processed in the processing chamber 2, and the next semiconductor wafer 4 is then transported into the processing chamber 2. When all of the semiconductor wafers 4 in the wafer holding means 6 are thus processed, the gate valve 3 is closed and the front door 5 is opened to remove the wafer holding means 6 from the chamber 1. Thereafter, another wafer holding means 6 is transported into the chamber 1 through the front door 5.

However, such a conventional single chamber type load-lock device has had the problem of low productivity because the processing apparatus must be stopped during the time required for replacing wafer holding means.

Under such circumstances, load-lock devices having a plurality of chambers have been developed to improve productivity. FIG. 1B schematically shows a conventional load-lock device having a plurality of chambers. This device comprises one transport mechanism 10, two load-lock chambers 8, 9 connected to the transport mechanism 10 through gate valves 12 and two processing chambers 13, 14 connected to the transport mechanism 10 through gate valves 12. The chambers 8, 9 respectively includes wafer holding means 16, 17 for standing by with a predetermined number of semiconductor wafers loaded thereon and door valves 11A, 11B for transporting processed semiconductors in order out of the chamber.

The door valves 11A, 11B of the respective load-lock chambers 8, 9 are opened to load a predetermined number of semiconductor wafers 18 into the wafer holding means 16, 17 and, thereafter, the interior of the chambers 8, 9 are evacuated. Then, a first gate valve 12A is opened to transport the semiconductor wafer 18 from the first load-lock chamber 8 to the processing chambers 13, 14 in order. When the process is completed, the semiconductor wafers 18 in the processing chambers 13, 14 are returned to the first load-lock chamber 8, and the first gate valve 12A is closed. Thereafter, a second gate valve 12B is opened to transport the semiconductor wafers 18 from the second load-lock chamber 9 to the processing chambers 13, 14 in order. Meanwhile, the door valve 11A of the first load-lock chamber 8 is opened to remove the processed semiconductor wafers in order and to load the next semiconductor wafers in the wafer holding means 16.

Such a conventional load-lock device having a plurality of chambers has reduced the so-called idle time of the processing chambers to thereby improve productivity.

However, such a conventional load-lock device having a plurality of chambers has problems as described below.

In a conventional load-lock device having a plurality of chambers, in order to improve the rate of operation of the processing chambers, while semiconductor wafers in the first load-lock chamber are processed, processed semiconductors must be removed from the second load-lock chamber to load new semiconductor wafers therein and the door valve must be closed to evacuate the second load-lock chamber to put in a stand-by state. If this operation can not be carried out while the semiconductor wafers are being processed, new semiconductor wafers can not be transported into the processing chambers in spite of which the process has already been completed, which leaves the processing chambers in a vacant state. Such a risk is significant especially for processes such as thin film processing which are performed in a short processing time. The same situation is likely to occur when a great number of chambers are used.

The number of load-lock chambers may be increased in order to avoid this. The conventional structure in which a plurality of load-lock chambers are disposed horizontally increases the size of an device as a whole, which goes against the needs in the market for reduction of the space for such an device. Conventional load-lock devices have such limitations from the view point of hardware.

It is therefore an object of the invention to provide a load-lock device and a method in which the space for an device can be reduced and productivity can be improved.

It is another object of the invention to provide a load-lock device and a therefor in which high productivity can be maintained even for many processing chambers and processes performed in a short processing time.

SUMMARY OF THE INVENTION

In order to achieve the above-mentioned objects, a load-lock device according to the present invention comprises means as described below.

There is provided a load-lock device which stands by with objects to be processed loaded thereon in order to cooperate with a transport mechanism in transporting the objects to be processed into a processing chamber in order, comprising:

chamber means;

wafer holding means for loading a plurality of the objects to be processed, the wafer holding means being movable up and down in the chamber; and flange means provided on a side of the wafer holding means, the flange means being engaged with a part of an inner wall of the chamber to divide the space inside the chamber into two isolated rooms.

Preferably, the transport mechanism is connected to a side of the chamber means substantially in the center thereof.

Preferably, the flange means is coupled to the side of the wafer holding means substantially in the center thereof and, when it is engaged with a part of the inner wall of the chamber, a part of the wafer holding means is completely isolated from the transport mechanism and the remaining part of the wafer holding means is exposed to the transport mechanism.

Further, the chamber preferably includes at least one door valve for transporting the objects to be processed into and out of the wafer holding means.

The wafer holding means is specifically supported by elevating means.

Furthermore, the flange means preferably includes sealing means.

There is provided a method for transporting objects to be processed loaded and kept in a load-lock device to and from predetermined processing chambers in order wherein the load-lock device comprises chamber means, wafer holding means for loading a plurality of the objects to be processed, the wafer holding means being movable up and down in the chamber and flange means provided on a side of the wafer holding means, the flange means being engaged with a part of an inner wall of the chamber to divide the space inside the chamber into two isolated rooms, the method comprising the steps of:

loading the objects to be processed in a first portion of the wafer holding means with the flange means in engagement and contact therewith in a first position and, in the mean time, transporting processed objects from the processing chamber and loading them to a second portion of the wafer holding means;

unloading the objects to be processed from the first portion of the wafer holding member and unloading them to the processing chamber with the wafer holding member moved to put the flange member in engagement and contact therewith in a second position and, in the mean time, transporting the processed objects from the second portion of the wafer holding means to the outside of the chamber;

loading the objects to be processed in the second portion of the wafer holding means with the flange means in engagement and contact therewith in the second position and, in the mean time, transporting processed objects from another processing chamber and loading them to the first portion of the wafer holding means;

unloading the objects to be processed from the second portion of the wafer holding member and transporting them to another processing chamber with the wafer holding member moved to put the flange member in engagement and contact therewith in the first position and, in the mean time, unloading the processed objects from the first portion of the wafer holding means to the outside of the chamber; and repeating the above steps.

The above-mentioned method may further comprise the steps of:

restoring the pressure in the room isolated from the transport mechanism to the atmospheric pressure during the loading of objects to be processed into the wafer holding means or the unload of the same to the outside of the chamber; and evacuating the room isolated from the transport mechanism after either loading the objects to be processed into the wafer holding means or transported unloading them from the wafer holding means is completed.

Preferably, the engagement between the flange means and a part of the chamber inner wall is maintained during the step of restoring the pressure in the room isolated from the transport mechanism to the atmospheric pressure.

DETAILED DESCRIPTION OF PREFERRED EMBODIMENTS

The present invention will now be described in detail with reference to the accompanying drawings.

Figure 1A:
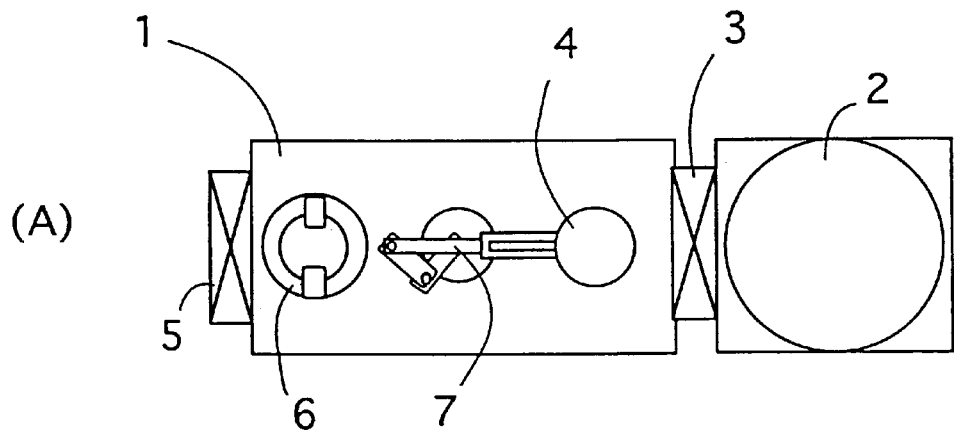
FIGS. 1A and 1B schematically illustrate a semiconductor manufacturing apparatus including conventional load-lock devices (the upper walls of the apparatus are omitted).
Figure 1B:
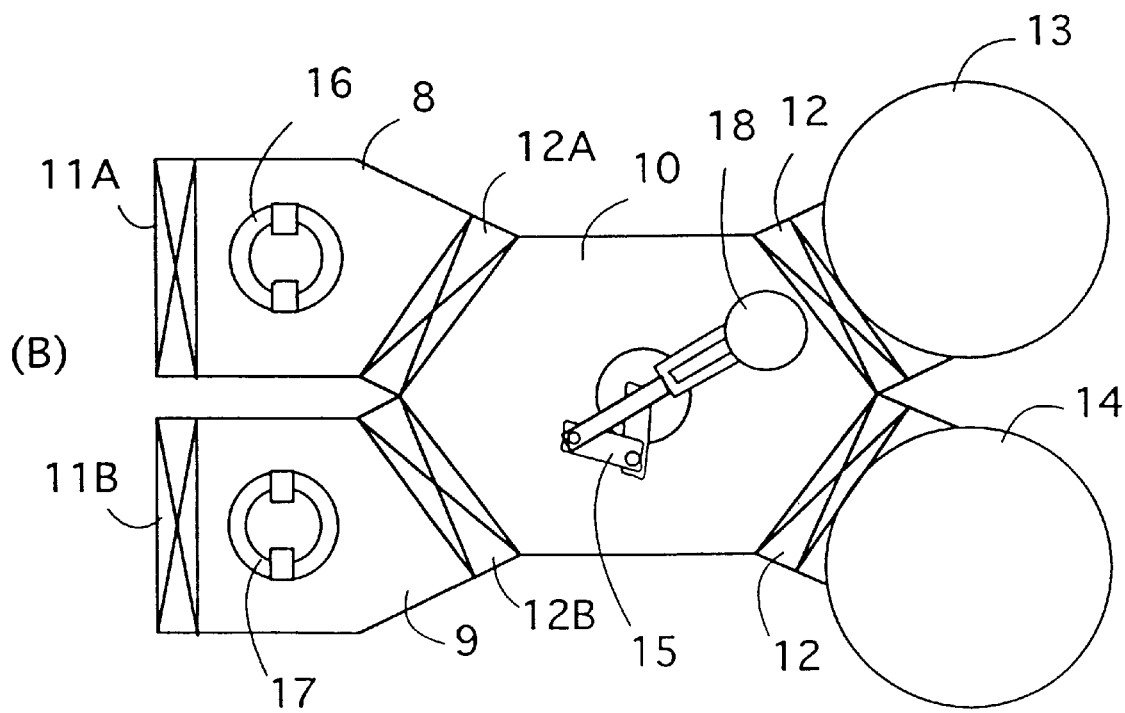
Figure 2:
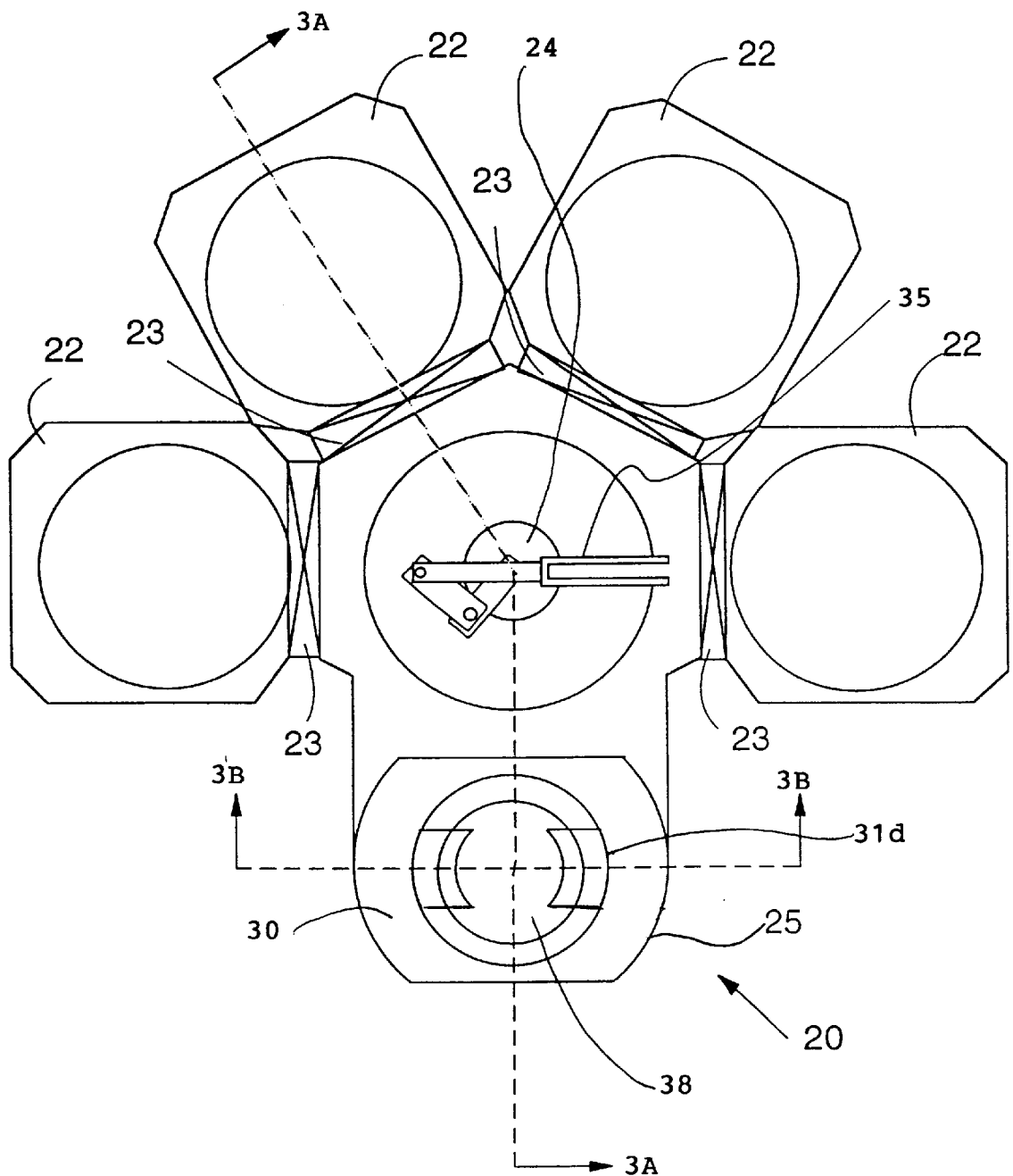
FIG. 2 is a schematic plan view of a preferred embodiment of a load-lock device according to the present invention, incorporated in a wafer-processing apparatus (the upper walls of the apparatus are omitted, and the arm 35 is retracted).
Figure 5:
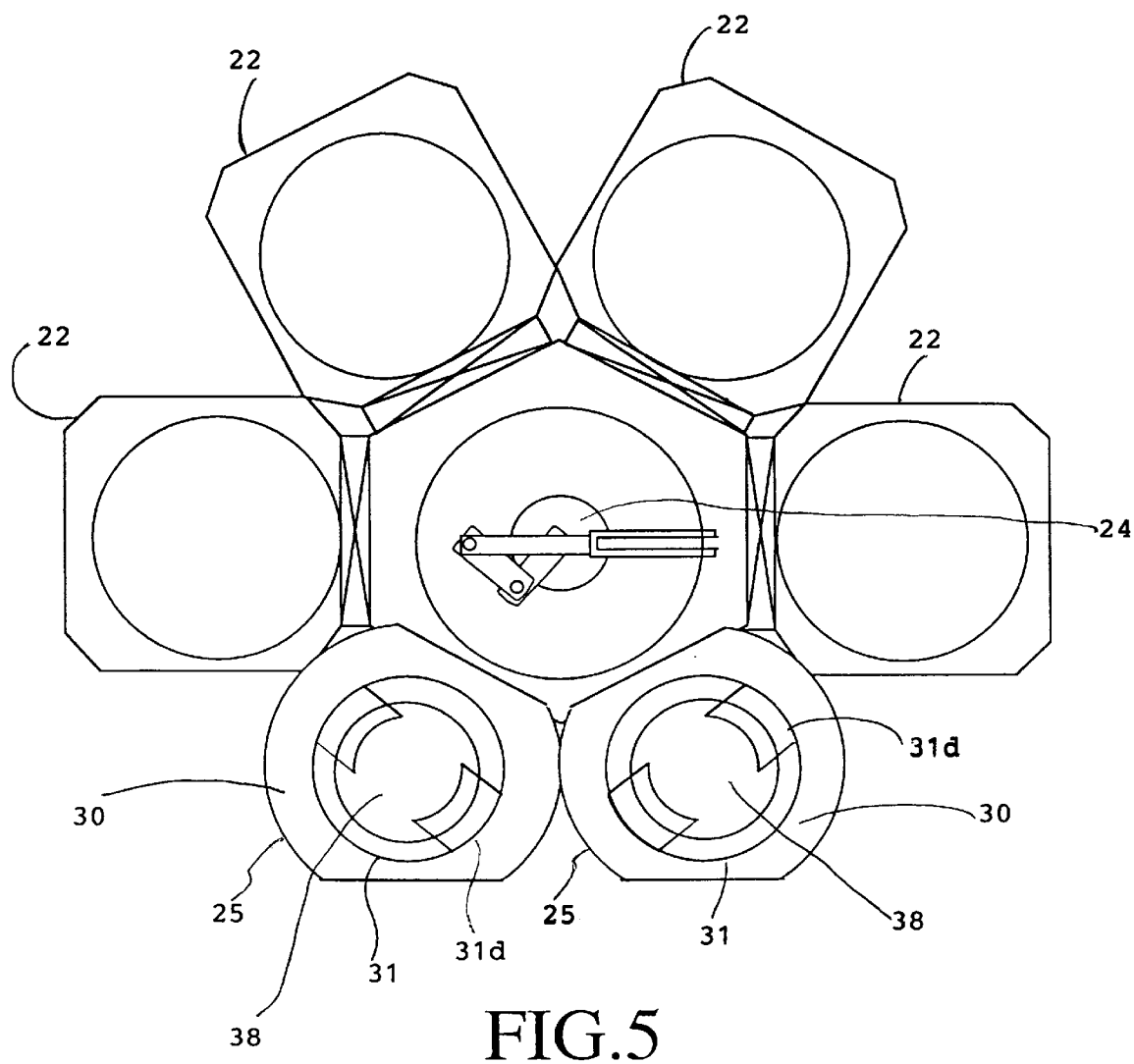
FIG. 5 is a schematic plan view of another embodiment of a load-lock device according to the present invention.

FIG. 2 is a schematic plan view of a semiconductor manufacturing apparatus including a load-lock device according to the present invention. The apparatus comprises a transport mechanism 24 in the middle thereof, a load-lock device 20 according to the invention connected to the transport mechanism 24 and four processing chambers 22 connected around the transport mechanism 24 through gate valves 23. It should be noted here that no gate valve intervenes between a load-lock chamber 25 and the transport mechanism 24 as will be described later in detail. This is the most significant feature of the present invention. The transport mechanism 24 is a normal arm type mechanism. For example, the processing chambers 22 are thermal CVD apparatuses or etching apparatuses. While the load-lock device 20 according to the invention comprises one load-lock chamber 25 in the preferred embodiment, it is possible to use two load-lock chambers provided adjacent to each other in the horizontal direction as shown in FIG. 5. Similarly, two or more load-lock chambers may be used.

Figures 3A, 3B:
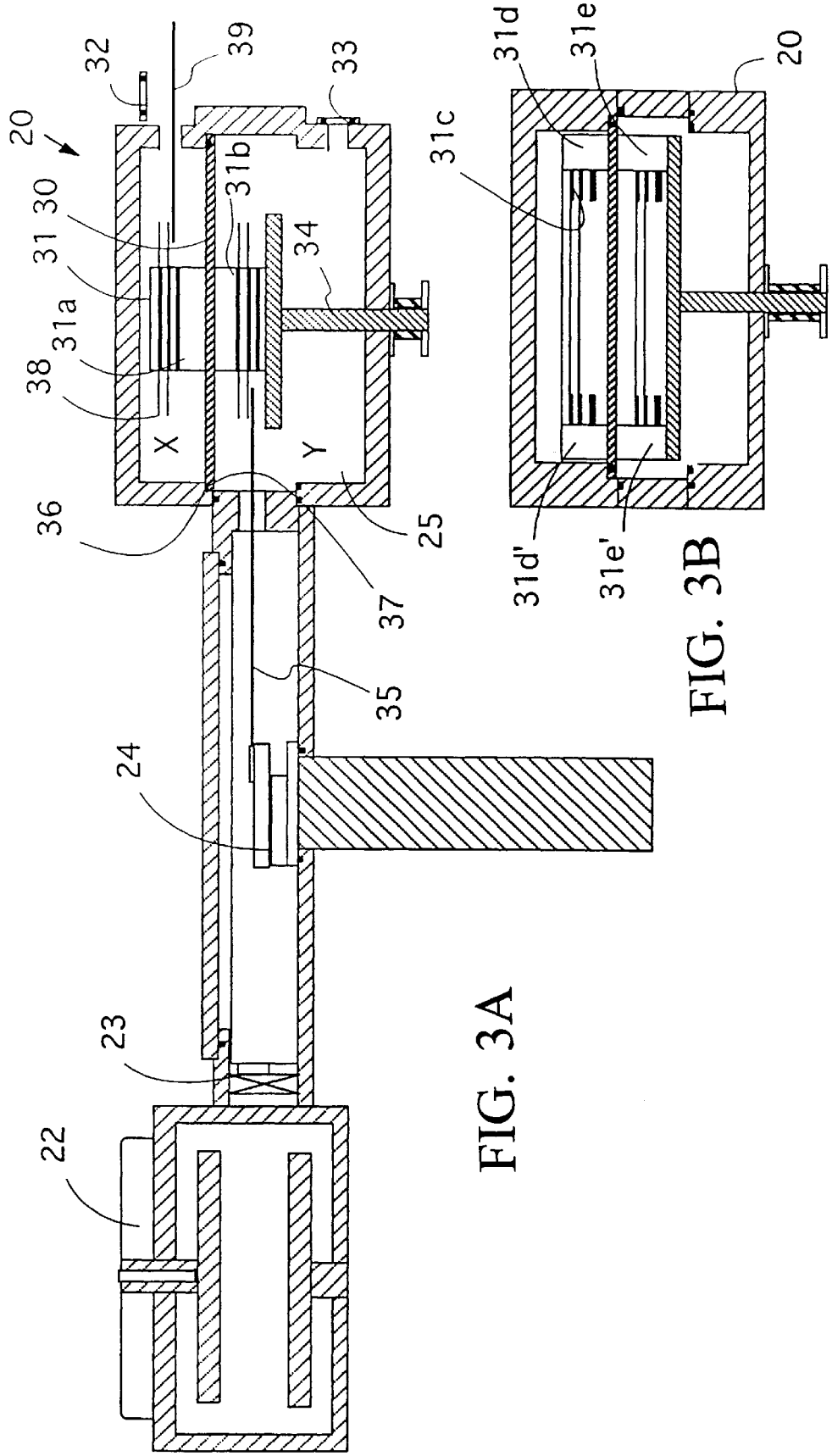
FIG. 3A is a schematic sectional view taken along the line 3A—3A in FIG. 2.
FIG. 3B is a schematic sectional view taken along the line 3B—3B in FIG. 2.

FIGS. 3A and 3B show sectional views of the apparatus shown in FIG. 2. FIGS. 3A and 3B show sectional views taken along the lines A—A and B—B indicated in FIG. 2, respectively.

The load-lock device 20 which stands by with semiconductor wafers loaded thereon in order to cooperate with the transporting mechanism for transporting the semiconductor wafers to the processing chambers in order comprises the chamber 25, wafer holding means 31 for loading semiconductor wafers 38 which is movable up and down in the chamber 25 and flange means 30 provided on a side of the wafer holding means 31 which is engaged with a contact portion 36 on the inner wall of the chamber to divide the space inside the chamber 25 into two isolated rooms X and Y.

The transport mechanism 24 is connected to substantially in the center of the chamber 25 and the semiconductor wafer 38 loaded on the wafer holding means 31 are transported to the processing chambers 22 by an arm mechanism 35. Preferably, two door valves 32, 33 are provided on a side of the chamber 25, and the semiconductor wafers 38 are loaded into and unloaded from the wafer holding means 31 through the door valves by an external arm mechanism 39. The door valves 32, 33 may function as outlet and inlet ports. The chamber 25 may include a separate outlet and/or inlet port for evacuating the interior of the chamber and/or taking air into there.

The wafer holding means 31 preferably comprises pairs of left and right supports 31d, 31d', 31e, 31e' and a plurality of loading portion 31c on which wafers are loaded. The wafer holding means 31 is divided by the flange means 30 into two upper and lower sections 31a and 31b. The number of the semiconductor wafers 38 loaded in the wafer holding means 31 depends on the number of the processing chambers 22 connected to the load-lock device and the kinds of the process, and an appropriate number is chosen by taking productivity into consideration. The wafer holding means 31 is supported by an elevating means 34 connected to an external driving device (not shown) and is movable up and down in the chamber 25.

Preferably, the flange means 30 is a disc made of a material which is not easily deformed and is coupled substantially to the center of the wafer holding means 31. When the wafer holding means 31 is elevated by the elevating means 34 to an upper limit position, the periphery of the flange means 30 comes into engage with the contact portion 36 on the inner wall of the chamber 25. Preferably, a sealing member 37 is provided at the periphery of the flange means and/or the contact portion 36 on the chamber inner wall. As a result, the upper section 31a of the wafer holding means 31 is completely isolated from the transport mechanism 24 and, at the same time, the lower section 31b of the wafer holding means 31 is exposed to the transport mechanism 24. Alternatively, the above-mentioned contact portion 36 may be a flange extending inside the chamber 25. In this case, the periphery of the flange means 30 is engaged with the flange provided on the inner wall of the chamber 25.

Figure 4:
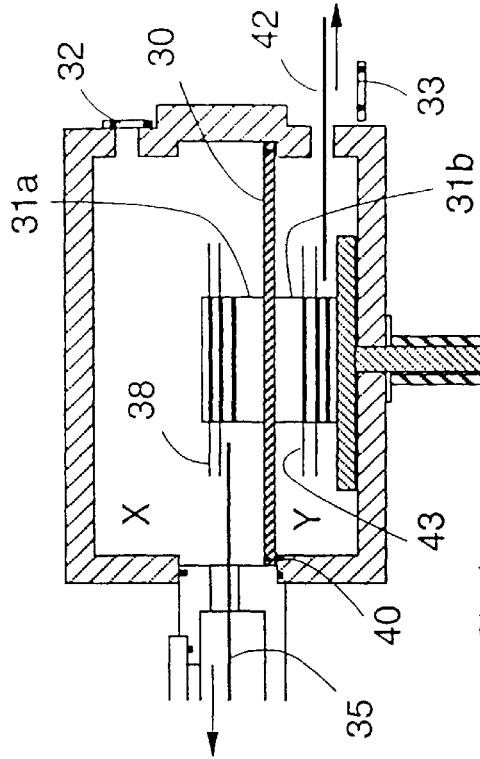
FIGS. 4A through 4D are enlarged sectional views of a load-lock device according to the present invention.
Figure 4:
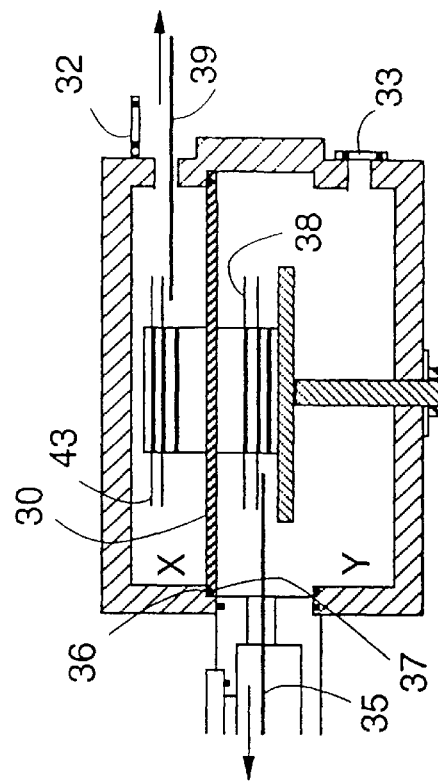
Figure 4:
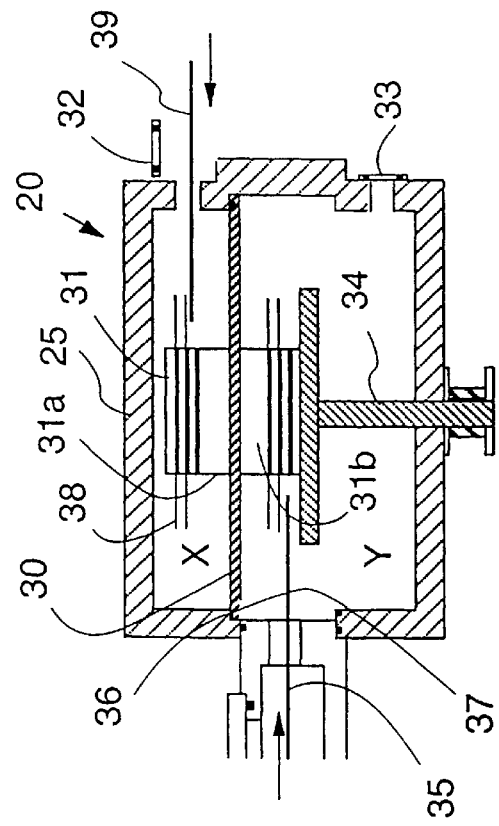
Figure 4:
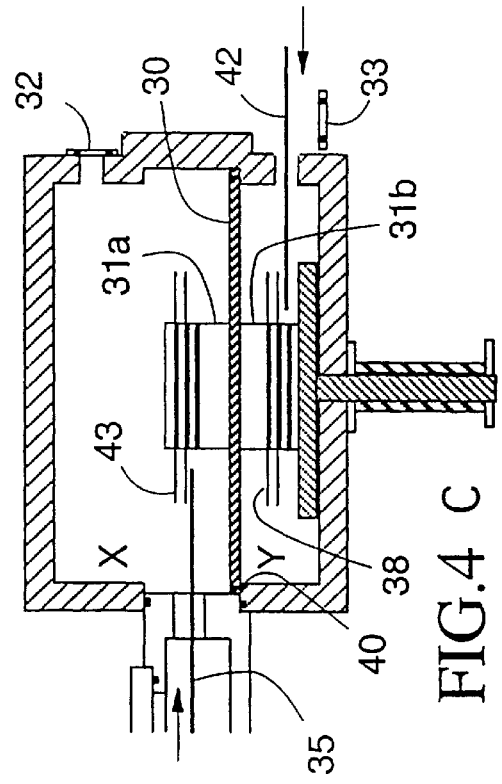

The operation of the load-lock device according to the invention will now be described. FIGS. 4A through 4D schematically show sectional views of the load-lock device according to the present invention. FIGS. 4A and 4D show the wafer holding means 31 in the upper limit position, and FIGS. 4B and 4C show the wafer holing means 31 in a lower limit position.

A method for transporting and removing semiconductor wafers loaded in a chamber to and from predetermined processing chambers in order using the load-lock device 20 according to the invention comprises the steps of:

opening the door valve 32 with the flange means 30 in engagement and contact with the contact portion 36 of the chamber inner wall in the upper limit position, loading new semiconductor wafers 38 into the upper section 31a of the wafer holding means 31 with the arm mechanism 39, closing the door valve 32 to evacuate the room X and, in the mean time, removing processed semiconductor wafers 43 from the processing chambers 22 and returning them to the lower section 31b of the wafer holding means 31 with the arm mechanism 35 (see FIG. 4A);

removing the semiconductor wafers 38 from the upper section 31a of the wafer holding means 31 and transporting them to the processing chambers 22 with the arm mechanism 35 with the wafer holding means 31 moved downward by the elevating means 34 to put the flange means 30 in engagement and contact with the contact portion 40 of the chamber inner wall at the lower limit position and, in the mean time, with opening the door valve 33, transporting the processed semiconductor wafers 43 from the lower section 31b of the wafer holding means 31 to the outside of the chamber with the arm mechanism 42 (FIG. 4B);

loading new semiconductor wafers 38 into the lower section 31b of the wafer holding means 31 and the door valve 33 is closed to evacuate the room Y with the flange means 30 in engagement and contact with the contact portion 40 of the chamber inner wall at the lower limit position and, in the mean time, removing processed semiconductor wafers 43 from the other processing chambers 22 and returning them to the upper section 31a of the wafer holding means 31 with the arm mechanism 35 (see FIG. 4C);

removing the semiconductor wafers 38 from the lower section 31b of the wafer holding means 31 and transporting them to the other processing chambers 22 with the arm mechanism 35 with the wafer holding means 31 elevated to put the flange means 30 in engagement and contact with the contact portion 36 of the inner wall of the chamber 25 at the upper limit position again and, in the mean time, with opening the door valve 32, transporting the processed semiconductor wafers 43 with the arm mechanism 39 from the upper section 31a of the wafer holding means 31 to the outside of the chamber (FIG. 4D); and repeating the above-mentioned steps.

An appropriate value is chosen for the number of semiconductor wafers loaded in the upper section 31a and lower section 31b of the wafer holding means 31 depending on the number of the processing chambers and the kinds of the process. During the steps of loading semiconductor wafers to the wafer from the outside of the chamber 25 holding means 31 and transporting them from the wafer holding means to the outside of the chamber 25, the atmospheric pressure is restored in the rooms as the door valves 32, 33 are opened and, as a result, the flange means 30 is subjected to a pressure that acts opposite to the direction of the engagement. In this case, the elevating means 34 preferably holds retains the wafer holding means to maintain the sealing.

With a load-lock device according to the invention, since the flange means 30 functions as a valve, it is possible to remove a gate valve which has been conventionally required between the transport mechanism 24 and load-lock chamber 25. This makes it possible to reduce the cost of the gate valve.

The removement of the gate valve makes it possible to eliminate a structure at a gate valve mounting area which has been provided on the inner wall of the chamber. As a result, the distance between the transport mechanism and load-lock chamber can be reduced by at least about 120 mm to achieve reduction of the dimension of the apparatus.

Further, since a load-lock device according to the invention has operations and effects substantially equivalent to those of a conventional load-lock device having two load-lock chambers arranged horizontally, the present invention allows one load-lock chamber as viewed in a plan view to achieve the same effect as that of two chambers. As a result, the area occupied by a transport mechanism and a load-lock device can be reduced by about 40%.

Furthermore, conventional load-lock devices have had a problem in that processing chambers can be stopped due to delay of replacement of objects to be processed in the case of thin film processing which is performed in a short processing time and when a number of processing chambers are used. The use of two load-lock devices according to the invention makes it possible to solve this easily because they substantially serve as four load-lock chambers. For example, the invention allows productivity to be improved by about 30% compared to a conventional load-lock device in the case of thin film processing in which three processing chambers are used and the processing time is about 40 seconds.

What is claimed is:

1. A load-lock device for transit storage of objects which are loaded onto and unloaded from the load-lock device, said load-lock device adapted to be connected to a transport device connected to at least one process chamber where the objects are processed, said load-lock device comprising:

a chamber having an interior defined by an inner wall for accommodating objects, said interior being accessible airtightly to an interior of the transport device through an opening provided in the chamber;

an object holder for loading objects, said object holder being disposed in the interior of the chamber and being movable in a direction such that each object loaded on the object holder is accessible to the transport device through the opening; and a flange extending outward from the object holder to the extent that the flange divides the interior of the chamber into two isolated compartments, said flange being movable with the object holder between two positions located astride the opening to the transport device, wherein when the flange is at the first position, the divided interior of the second compartment is communicated with the interior of the transport device through the opening, whereas when the flange is at the second position, the divided interior of the first compartment is communicated with the interior of the transport device through the opening.

2. A device according to claim 1, wherein said opening to the transport device is located substantially at a mid point of the chamber with respect to the movable direction of the object holder.

3. A device according to claim 2, wherein said flange is located substantially at a mid point of the object holder with respect to its movable direction.

4. A device according to claim 2, wherein said chamber further comprises at least one door valve communicated with the divided interior of the first compartment or the second compartment, through which door valve objects are loaded to and unloaded from the chamber.

5. A device according to claim 2, wherein said object holder is adapted to be connected to an elevating actuator.

6. A device according to claim 2, wherein said flange comprises sealing portions for sealing the first and second positions of the inner wall of the chamber when the flange is positioned at the first and second positions, respectively.

7. A device according to claim 2, wherein the object holder is movable in a vertical direction, supports each object individually, and stacks a plurality of objects in the vertical direction.

8. A device according to claim 7, wherein the flange is located at a mid point of a stack of the objects, wherein plural objects are loaded in each of the first and second compartments.

9. A device according to claim 8, wherein each of the first and second compartments has a door valve for loading and unloading the objects.

10. A method for transporting objects between a load-lock device for transit storage of objects and at least one process chamber, by using a transporting device disposed between the load-lock device and the at least one process chamber, said load-lock device comprising: (a) a chamber having an interior defined by an inner wall for accommodating objects, said interior being accessible airtightly to an interior of the transport device through an opening provided in the chamber; (b) an object holder for loading objects, said object holder being disposed in the interior of the chamber and being movable in a direction such that each object loaded on the object holder is accessible to the transport device through the opening; and (c) a flange extending outward from the object holder to the extent that the flange divides the interior of the chamber into two isolated compartments, said flange being movable with the object holder between two positions located astride the opening to the transport device, wherein when the flange is at the first position, the divided interior of the second compartment is communicated with the interior of the transport device through the opening, whereas when the flange is at the second position, the divided interior of the first compartment is communicated with the interior of the transport device through the opening, said method comprising the steps of:

(a) when the flange is engaged with the inner wall at first position, loading unprocessed objects in the object holder within the first compartment, and loading processed objects transported from the process chamber in the object holder within the second compartment;

(b) moving the object holder to engage the flange with the inner wall at the second position;

(c) when the flange is engaged with the inner wall at the second position, unloading the unprocessed objects from the object holder within the first compartment to transport the unprocessed objects to the process chamber, and unloading the processed objects from the object holder within the second compartment to discharge the processed objects;

(d) when the flange remains at the second position, loading unprocessed objects in the object holder within the second compartment, and loading processed objects transported from the process chamber in the object holder within the first compartment;

(e) moving the object holder to engage the flange with the inner wall at the first position; and (f) when the flange is engaged with the inner wall at the first position, unloading the unprocessed objects from the object holder within the second compartment to transport the unprocessed objects to the process chamber, and unloading the processed objects from the object holder within the first compartment to discharge the processed objects.

11. A method according to claim 10, wherein steps (a) through (f) are repeated.

12. A method according to claim 10, further comprising the steps of:

evacuating the compartment, which is not communicated with the interior of the transport device, upon completion of loading unprocessed objects or unloading processed object; and restoring the pressure in the compartment, which is not communicated with the interior of the transport device, to the atmospheric pressure when loading unprocessed objects into the object holder or unloading processed objects.

13. A method according to claim 12, wherein the engagement between the flange and the inner wall is maintained during the step of restoring the pressure.

14. A method according to claim 10, wherein each of the first and second compartments has a door valve, and unprocessed objects are loaded and processed objects are unloaded therethrough.

* * * * *